United States Patent
Kang

(10) Patent No.: US 7,266,006 B2
(45) Date of Patent: Sep. 4, 2007

(54) MULTIPLE-LAYER SERIAL DIODE CELL AND NONVOLATILE MEMORY DEVICE USING THE SAME

(75) Inventor: Hee Bok Kang, Daejeongwangyeok-si (KR)

(73) Assignee: Hynix Semiconductor Inc., Icheon-Si (KR)

(*) Notice: Subject to any disclaimer, the term of this patent is extended or adjusted under 35 U.S.C. 154(b) by 119 days.

(21) Appl. No.: 11/024,879

(22) Filed: Dec. 30, 2004

(65) Prior Publication Data

US 2005/0152174 A1    Jul. 14, 2005

(30) Foreign Application Priority Data

Jan. 13, 2004    (KR) .................. 10-2004-0002240

(51) Int. Cl.
*G11C 11/22*    (2006.01)

(52) U.S. Cl. ............... 365/145; 365/175; 257/107; 257/110

(58) Field of Classification Search ............... 365/129, 365/145, 159, 174, 175; 257/107, 110
See application file for complete search history.

(56) References Cited

U.S. PATENT DOCUMENTS

| 6,344,991 B1 * | 2/2002 | Mikami et al. ............ 365/145 |
| 6,653,665 B2 * | 11/2003 | Kajiyama .................. 257/133 |

* cited by examiner

*Primary Examiner*—VanThu Nguyen
(74) *Attorney, Agent, or Firm*—Townsend and Townsend and Crew LLP

(57) ABSTRACT

A multiple-layer serial diode cell and a nonvolatile memory device using the same enable reduction in the number of cell arrays by configuring cell arrays including a nonvolatile ferroelectric capacitor and a serial diode cell as multiple layers. In the nonvolatile memory device, a unit serial diode cell comprising a nonvolatile ferroelectric capacitor and a serial diode switch which does not require an additional gate control signal is positioned between a word line and a bit line, thereby embodying a cross point cell array, which is configured as a multiple layer to reduce the whole chip size.

6 Claims, 16 Drawing Sheets

MULTIPLE-LAYER SERIAL DIODE CELL AND NONVOLATILE MEMORY DEVICE USING THE SAME

BACKGROUND ART

1. Field of the Invention

The present invention generally relates to a nonvolatile memory device using a multiple-layer serial diode cell, and more specifically, to a technology of configuring cell arrays including a nonvolatile ferroelectric capacitor and a serial diode cell as a multiple-layer to reduce the number of cell arrays.

2. Description of the Prior Art

Generally, a ferroelectric random access memory (hereinafter, referred to as 'FeRAM') has attracted considerable attention as next generation memory device because it has a data processing speed as fast as a Dynamic Random Access Memory (hereinafter, referred to as 'DRAM') and conserves data even after the power is turned off.

The FeRAM having structures similar to the DRAM includes the capacitors made of a ferroelectric substance, so that it utilizes the characteristic of a high residual polarization of the ferroelectric substance in which data is not deleted even after an electric field is eliminated.

The technical contents on the above FeRAM are disclosed in the Korean Patent Application No. 2001-57275 by the same inventor of the present invention. Therefore, the basic structure and the operation on the FeRAM are not described herein.

A unit cell of the conventional FeRAM comprises a switching device and a nonvolatile ferroelectric capacitor which is connected between one terminal of the switching device and a plate line. The switching device performs a switching operation depending on a state of a word line to connect the nonvolatile ferroelectric capacitor to a sub bit line.

Here, the switching device of the conventional FeRAM is generally a NMOS transistor whose switching operation is controlled by a gate control signal.

However, when a cell array is embodied by using the above-described NMOS transistor as a switching device, the whole chip size increases. As a result, it is necessary to embody a cross point cell by using the above-described FeRAM having a nonvolatile characteristic and a serial diode switch which does not require a gate control signal, and to effectively arrange the cross point cell and a circuit device region for controlling the same, thereby reducing the whole chip size.

SUMMARY OF THE INVENTION

Accordingly, it is an object of the present invention to configure a serial diode switch to have a multiple-layer with an interlayer insulating film, thereby reducing the array size.

It is another object of the present invention to embody a cross point cell using a nonvolatile ferroelectric capacitor and a serial diode switch which does not an additional gate control signal, thereby reducing the whole size of the nonvolatile memory device.

It is still another object of the present invention to effectively drive read/write operations in cell arrays using the nonvolatile ferroelectric capacitor and the serial diode switch which are described above, thereby improving operation characteristics of the memory cell.

In an embodiment, a multiple-layer serial diode cell comprises a unit serial diode cell including a serial diode switch, a nonvolatile ferroelectric capacitor, a bit line, a contact node, and a word line. The serial diode switch comprises an insulating layer formed on a substrate and at least two or more of diode devices which are made of a silicon layer on the insulating layer and connected in series. The nonvolatile ferroelectric capacitor, which comprises a top electrode, a ferroelectric film and a bottom electrode, reads/writes corresponding data depending on the amount of current applied from a word line or a bit line. The bit line is connected to both nodes of the serial diode switch through a bit line contact node. The contact node connects an interval between the bottom electrode and a common node connected to two or more of the diode devices. a word line formed on the top electrode. Here, a plurality of the unit serial diode cells are arranged in row and column directions, and the plurality of unit serial diode cells are deposited with a multiple structure which is separated by the insulating layer.

In an embodiment, a nonvolatile memory device using a multiple-layer serial diode cell comprises a plurality of multiple-layer serial diode cell arrays, a plurality of word line driving units, and a plurality of sense amplifiers. Each of the plurality of multiple-layer serial diode cell arrays, which are arranged in row and column directions, deposited with a multiple-layer structure, separated by an insulating layer includes a plurality of multiple-layer serial diode cells. The plurality of word line driving units selectively drive word lines of the plurality of multiple-layer serial diode cell arrays. The plurality of sense amplifiers sense and amplify data applied from the plurality of multiple-layer serial diode cell arrays. Here, each of the plurality of multiple-serial diode cells comprises a nonvolatile ferroelectric capacitor and a serial diode switch. One terminal of the nonvolatile ferroelectric capacitor is connected to the word line. The serial diode switch, connected between a bit line and the other terminal of the nonvolatile ferroelectric capacitor, comprises at least two or more diode devices for being selectively switched depending on voltages applied to the word line and the bit line.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 1:
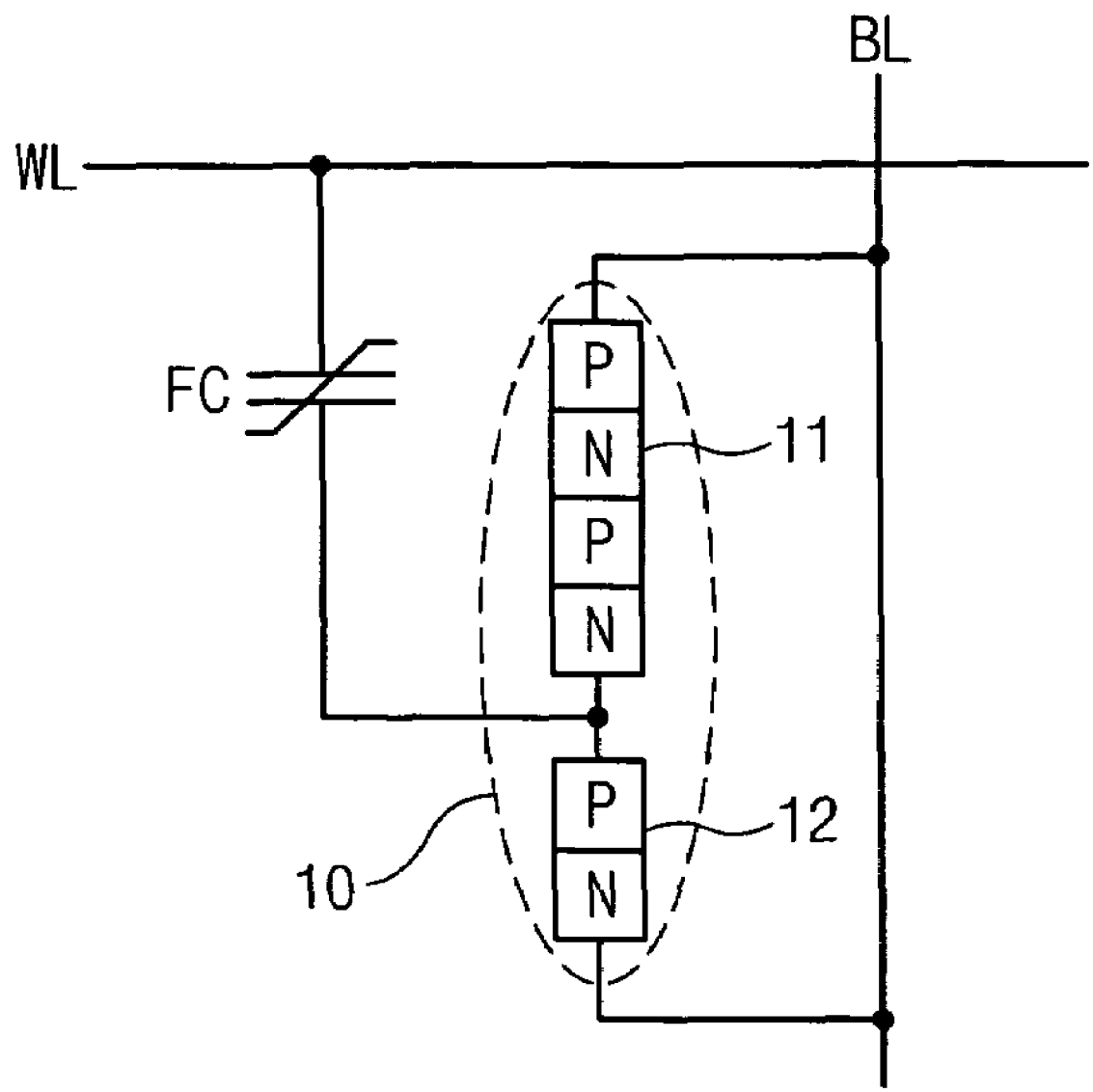
FIG. 1 is a diagram illustrating a unit cell of a multiple-layer serial diode cell according to an embodiment of the present invention.

FIG. 1 is a diagram illustrating a unit cell of a multiple-layer serial diode cell according to an embodiment of the present invention.

In an embodiment, a unit serial diode cell comprises a nonvolatile ferroelectric capacitor FC and a serial diode switch 10. Here, the serial diode switch 10 includes a PNPN diode switch 11 and a PN diode switch 12. The PNPN diode switch 11 and the PN diode switch 12 are connected in parallel between a bit line and a bottom electrode of the nonvolatile ferroelectric capacitor FC.

The PNPN diode switch 11 is connected backward between the bit line BL and one electrode of the nonvolatile ferroelectric capacitor FC, and the PN diode switch 12 is connected between forward between the bit line BL and one electrode of the nonvolatile ferroelectric capacitor FC. The other electrode of the nonvolatile ferroelectric capacitor FC is connected to a word line WL.

Figure 2:
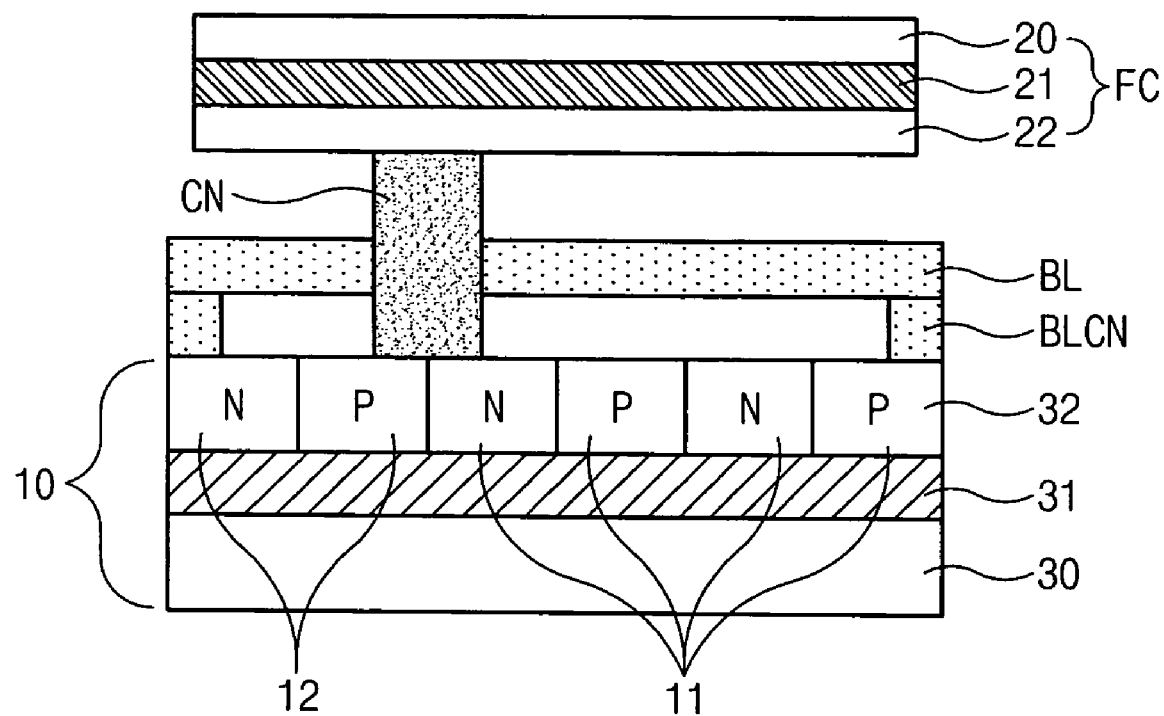
FIG. 2 is a cross-sectional diagram illustrating the unit cell of the multiple-layer serial diode cell of FIG. 1.

FIG. 2 is a cross-sectional diagram illustrating the unit cell of the multiple-layer serial diode cell of FIG. 1.

The serial diode switch 10 comprises an insulating layer 31 formed on a silicon substrate 30 and a silicon layer 32 formed on the insulating layer 31, to have a SOI (Silicon On Insulator) structure. Here, the insulating layer 31 made of $SiO_2$ is deposited on the silicon substrate 30, and the silicon layer 32 is formed on the insulating layer 31. The silicon layer 32 forms a diode chain including the PNPN diode switch 11 and the PN diode switch 12 which are connected serially. The diode switches 11,12 are made of growth silicon or polysilicon.

The PNPN diode switch 11 includes a plurality of P-type regions and N-type regions which are alternately connected in series. The PN diode switch 12 includes a P-type region and a N-type region which are connected serially to the adjacent N-type region of the PNPN diode switch 11.

The bit line BL is formed through a bit line contact node BLCN on the N-type region of the PN diode switch 12 and the P-type region of the PNPN diode switch 11. Also, the P-type region of the PN diode switch 12 and the N-type region of the PNPN diode switch 11 are connected to a bottom electrode 22 of the nonvolatile ferroelectric capacitor FC through a common contact node CN.

Here, the nonvolatile ferroelectric capacitor FC comprises a top electrode 20, a ferroelectric layer 21 and a bottom electrode 22. The top electrode 20 of the nonvolatile ferroelectric capacitor FC is connected to the word line WL.

Figure 3:
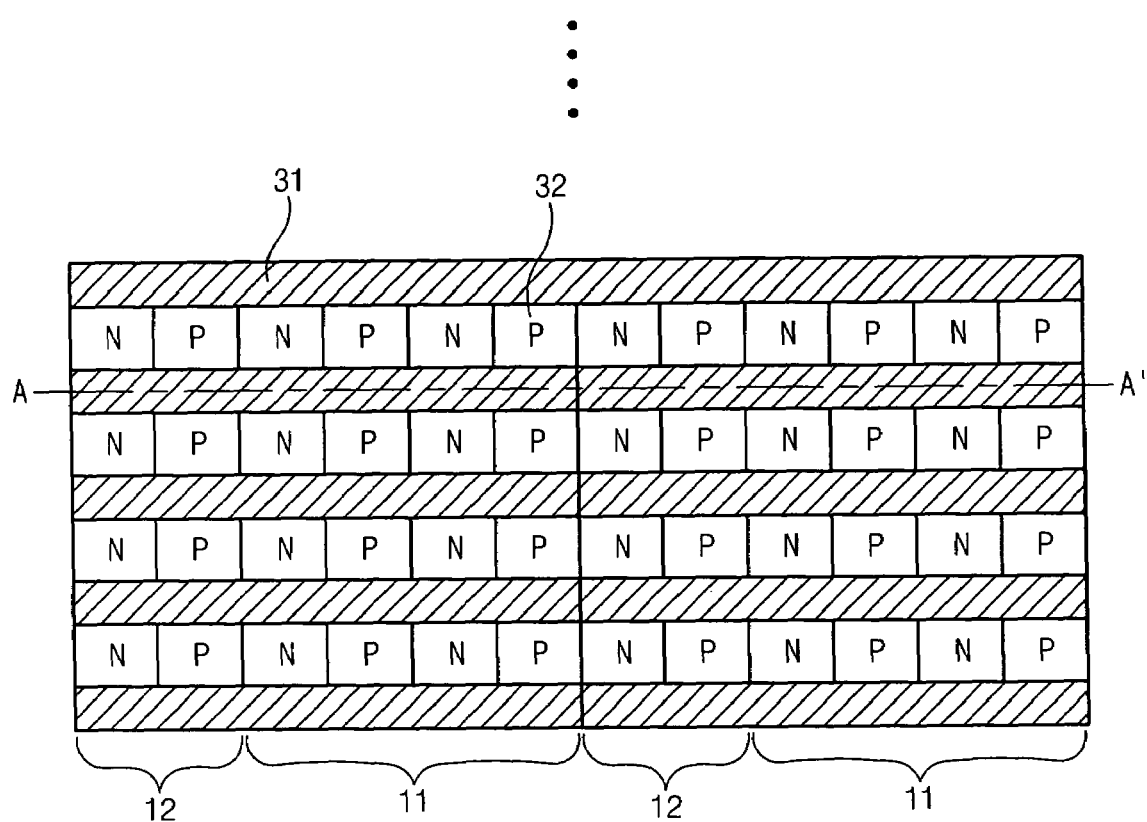
FIG. 3 is a plane diagram illustrating a serial diode switch of FIG. 1.

FIG. 3 is a plane diagram illustrating the serial diode switch 10 of FIG. 1.

The serial diode switch 10 includes the PNPN diode switch 11 and the PN diode switch 12 which are formed of the silicon layer 32 and successively connected with a serial chain type. That is, one serial diode cell comprises the PN diode switch 12 and the PNPN diode switch 11 which are connected serially. A serial diode cell adjacent to the one serial diode cell in the same direction includes the PN diode switch 12 and the PNPN diode switch 11 which are connected serially.

The insulating layer 31 is interposed between a plurality of the serial diode switches 10. That is, the upper serial diode switch 10 and the lower serial diode switch 10 are separated by the insulating layer 31.

As a result, one serial diode cell region is configured by selecting one PN diode switch 12 and one PNPN diode switch 11 from diode devices connected in series.

Figure 4:
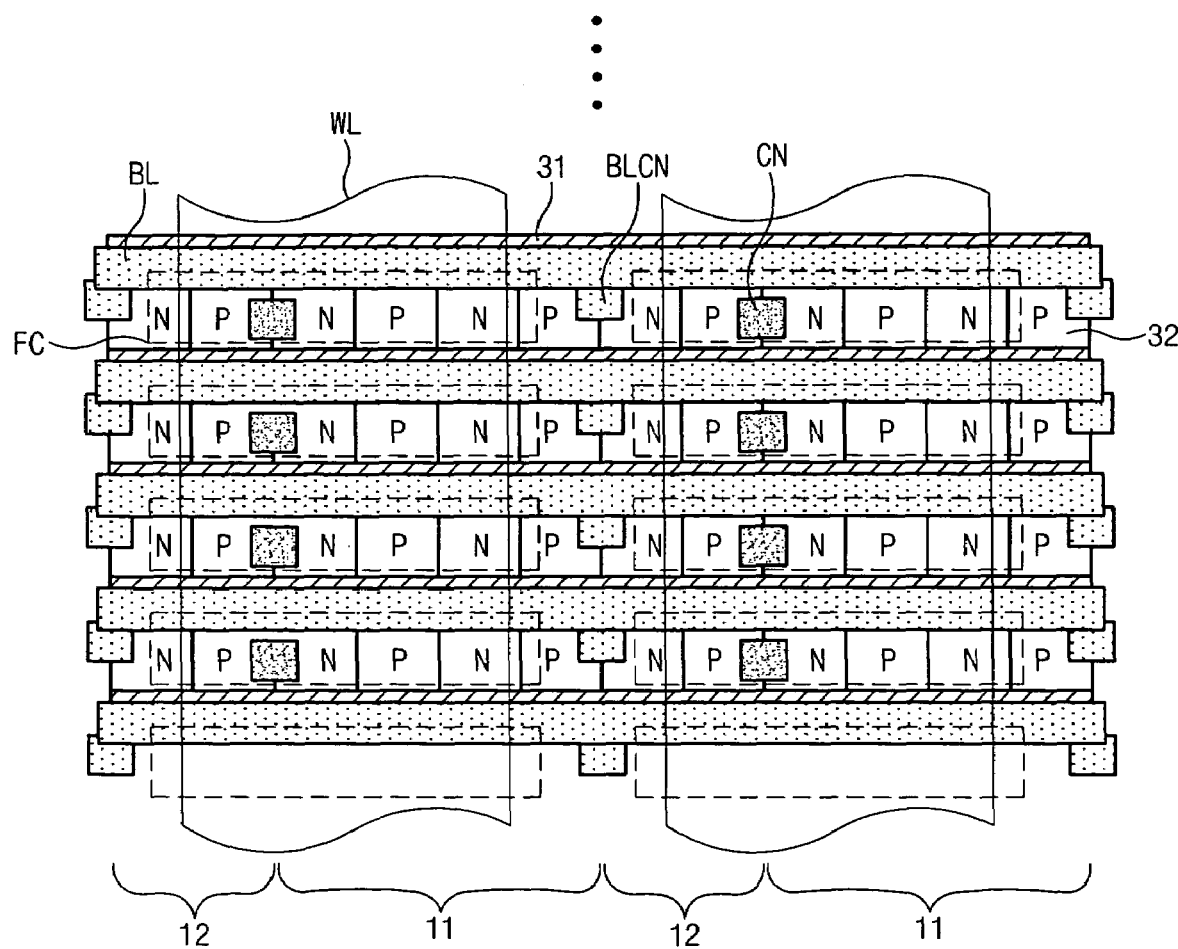
FIG. 4 is a plane diagram illustrating a multiple-layer serial diode cell of FIG. 1.

FIG. 4 is a plane diagram illustrating a multiple-layer serial diode cell of FIG. 1.

The silicon layer 32 made of growth silicon or polysilicon forms the PNPN diode switch 11 and the PN diode switch 12 which are connected serially. In each silicon layer 32, its upper and lower portions are insulated. In the serial diode switch 10, the P-type region of the PN diode switch 12 is formed adjacent to the N-type region of the PNPN diode switch 11 to be connected in common to a contact node CN of the nonvolatile ferroelectric capacitor FC.

Also, the N-type region of the PN diode switch 12 and the P-type region of the PNPN diode switch 11 are connected to the bit line BL through the bit line contact node BLCN. The bit line contact node BLCN is connected in common to the bit line contact node BLCN of the adjacent serial diode cell. That is, the same bit line contact node BLCN is connected in common to the P-type region of the PNPN diode switch 11 and the N-type region of the adjacent PN diode switch 12.

A word line WL is formed on the nonvolatile ferroelectric capacitor FC.

Figure 5:
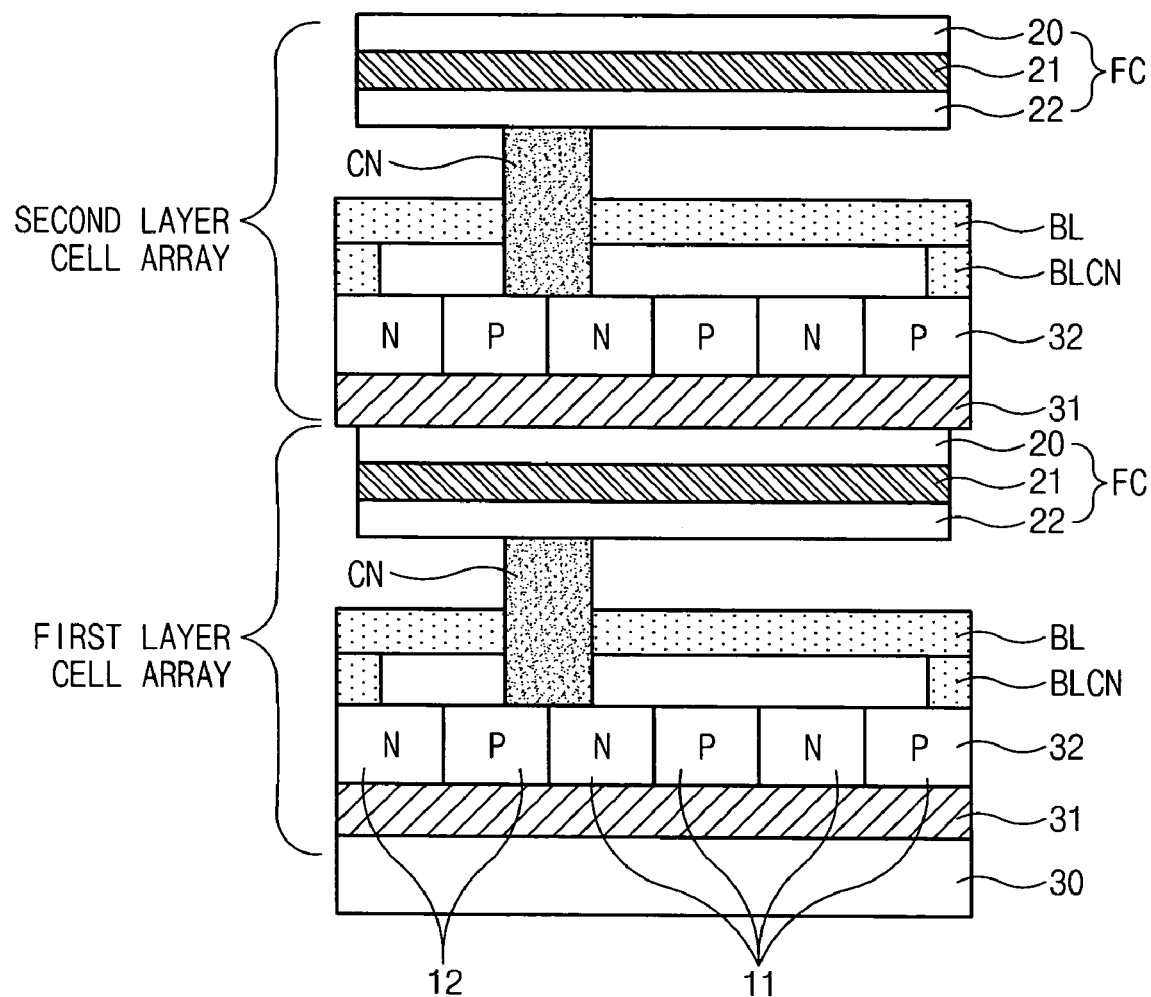
FIGS. 5 and 6 are cross-sectional diagrams illustrating a multiple-layer serial diode cell according to an embodiment of the present invention.
Figure 6:
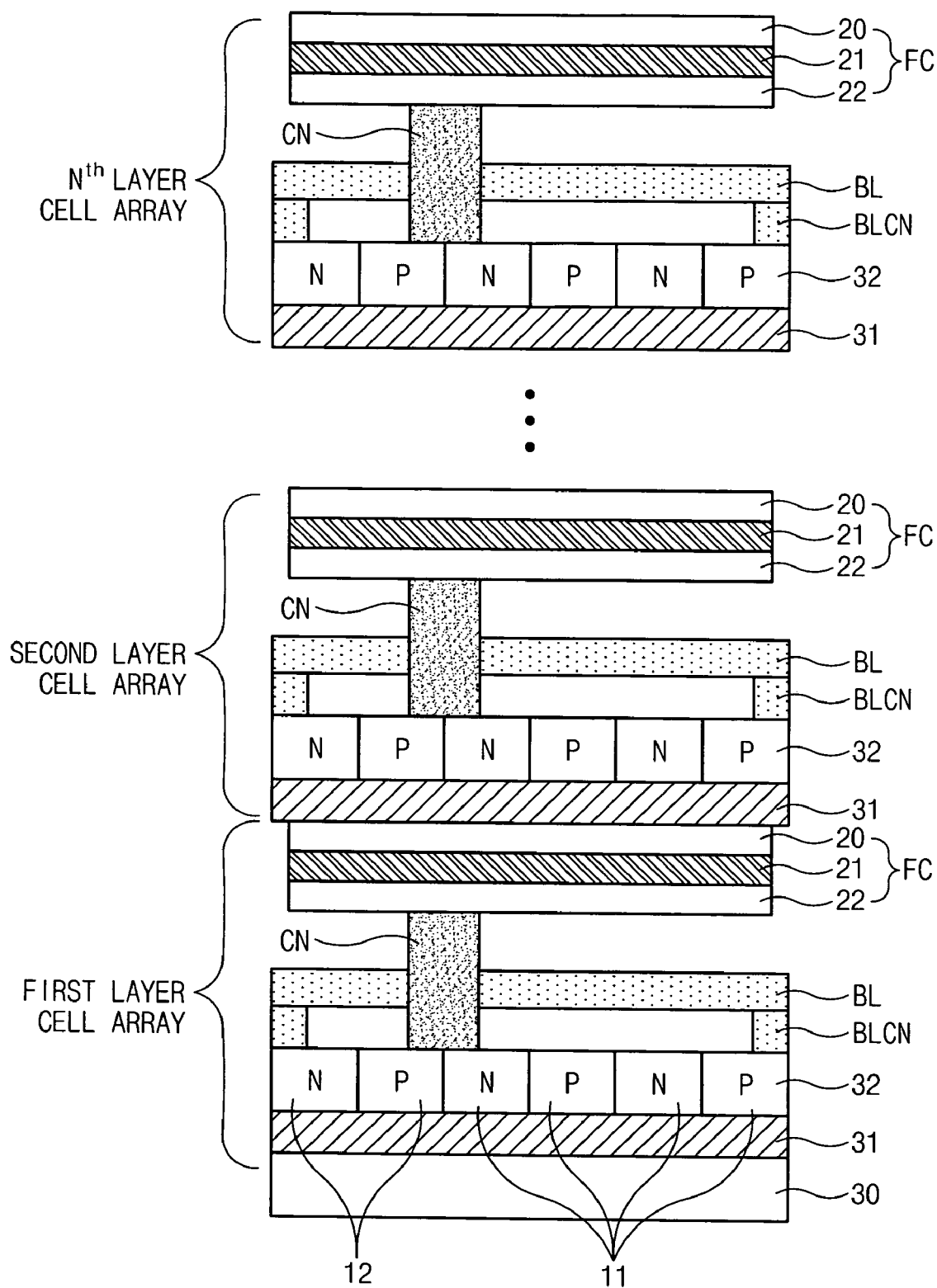

FIGS. 5 and 6 are cross-sectional diagrams illustrating a multiple-layer serial diode cell according to an embodiment of the present invention.

A multiple-layer serial diode cell comprises a unit serial diode cell as a first layer cell array as shown in FIG. 2 and a second layer cell array deposited on the first layer cell array. Here, the insulating separation layer 31 is deposited on the nonvolatile ferroelectric capacitor FC formed on the first layer cell array, thereby insulating the first layer cell array from the second layer cell array.

Then, the serial diode switch 10 made of polysilicon or growth silicon is deposited on the insulating separation layer 31 of the second layer cell array. As a result, the serial diode switch 10 formed in the first layer cell array is separated from that in the second layer cell array by the insulating separation layer 31.

The embodiment of FIG. 6 shows that the unit serial diode cell of FIG. 2 can be comprised of n multiple-layer cell arrays.

Figure 7:
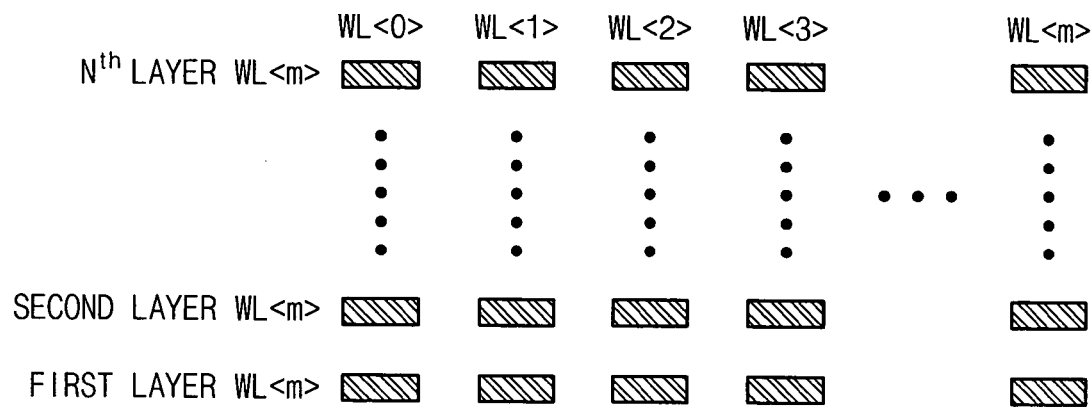
FIG. 7 is a cross-sectional diagram illustrating a word line array of the multiple-layer serial diode cell of FIG. 6.

FIG. 7 shows a cross section of a word line array of the multiple-layer serial diode cell when the insulating layer 31 of the serial diode switch 10 in FIG. 3 is cut in a A-A' direction.

A plurality of word line arrays are arranged in a row direction, respectively. A plurality of word lines WL are sequentially deposited on a first layer word line WL. The word lines WL in each layer are separated by the insulating layer 31.

Figure 8:
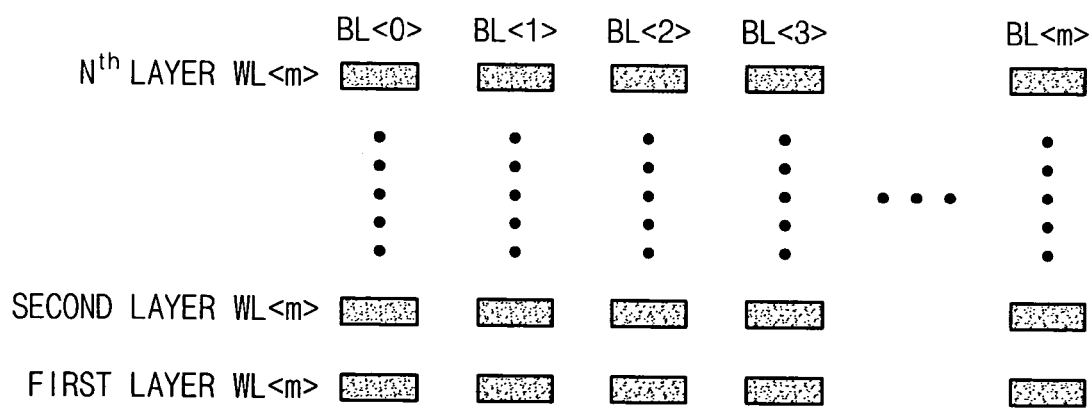
FIG. 8 is a cross-sectional diagram illustrating a bit line array of the multiple-layer serial diode cell of FIG. 6.

FIG. 8 shows a cross section of a bit line array of the multiple-layer serial diode cell when the insulating layer 31 of the serial diode switch 10 in FIG. 3 is cut in a A-A' direction.

A plurality of but line arrays are arranged in a row direction, respectively. A plurality of bit lines BL are sequentially deposited on a first layer bit line BL. The bit lines BL in each layer are separated by the insulating layer 31.

Figure 9:
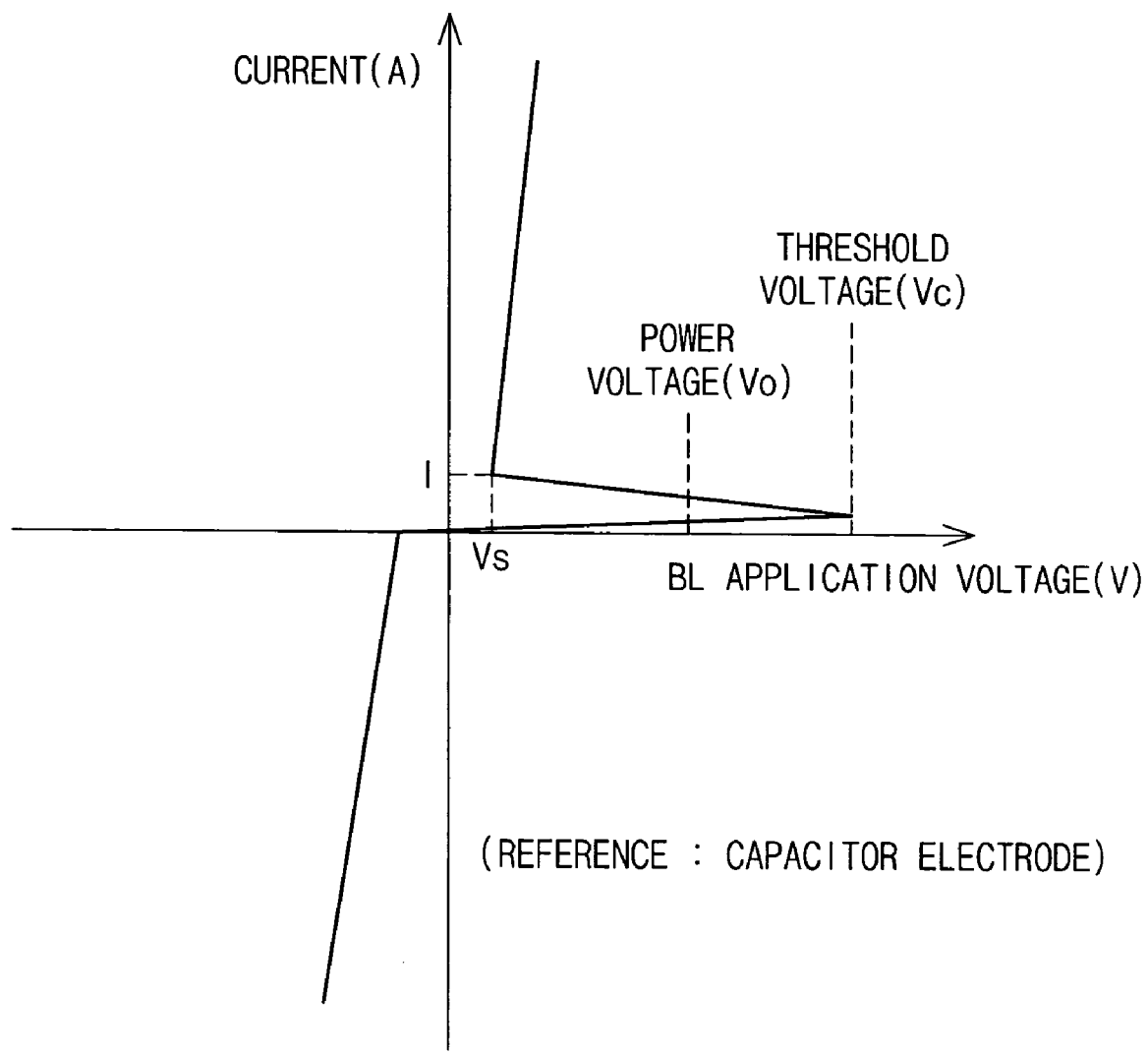
FIG. 9 is a diagram illustrating the operation of the serial diode switch of FIG. 1.

FIG. 9 is a diagram illustrating the operation of the serial diode switch 10 of FIG. 1.

When a voltage applied to the bit line BL increases in a positive direction based on the nonvolatile ferroelectric capacitor FC, the serial diode switch 10 is kept off by the operation characteristic of the PNPN diode switch 11, so that current does not flow in an operating voltage Vo.

Thereafter, when the voltage applied to the bit line BL more increases to reach a threshold voltage Vc, the PNPN diode switch 11 is turned on by the forward operation characteristic of the diode, and the serial diode switch 10 is turned on, so that current dramatically increases. Here, when the voltage applied to the bit line BL is over the threshold voltage Vc, the value of current I is caused by a value of a resistor (not shown) which serves as load connected to the bit line BL.

A large amount of current can flow even when a small voltage Vs applied to the bit line BL after the PNPN diode switch 11 is turned on. Here, the PN diode switch 10 is kept off by the backward operation characteristic.

On the other hand, if the voltage applied to the bit line BL increases in a negative direction based on the nonvolatile ferroelectric capacitor FC, that is, when a predetermined voltage is applied to the word line WL, the serial diode switch 10 is turned on by the forward operation characteristic of the PN diode switch 12, so that current flows in a random operating voltage. Here, the PNPN diode switch 11 is kept off by the backward operation characteristic.

Figure 10A:
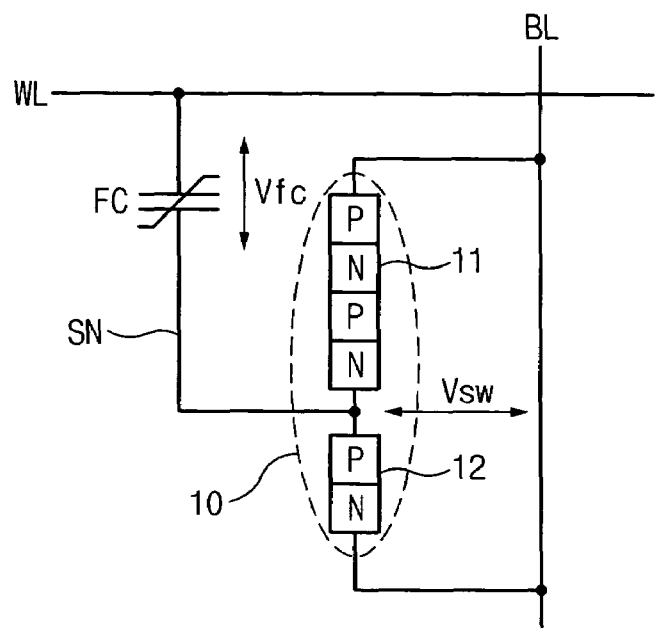
FIGS. 10a to 10c are diagrams illustrating the voltage dependency of the word line and the bit line of the multiple-layer serial diode cell according to an embodiment of the present invention.
Figure 10B:
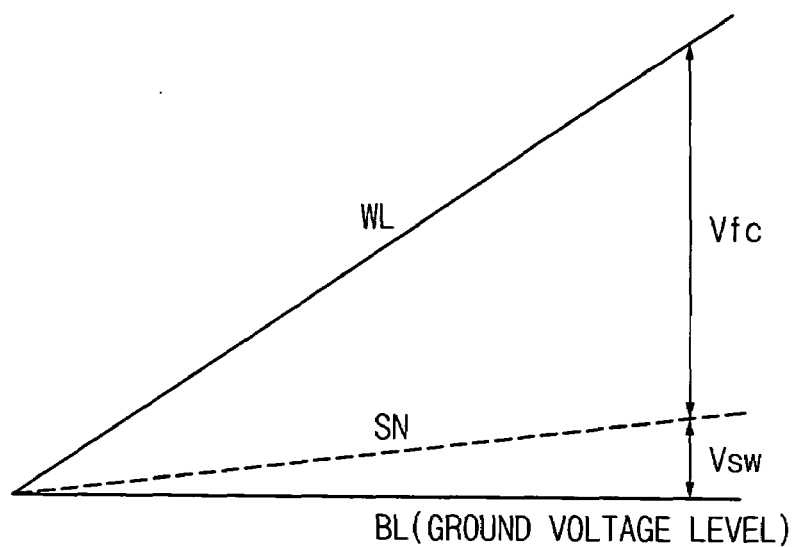
Figure 10C:
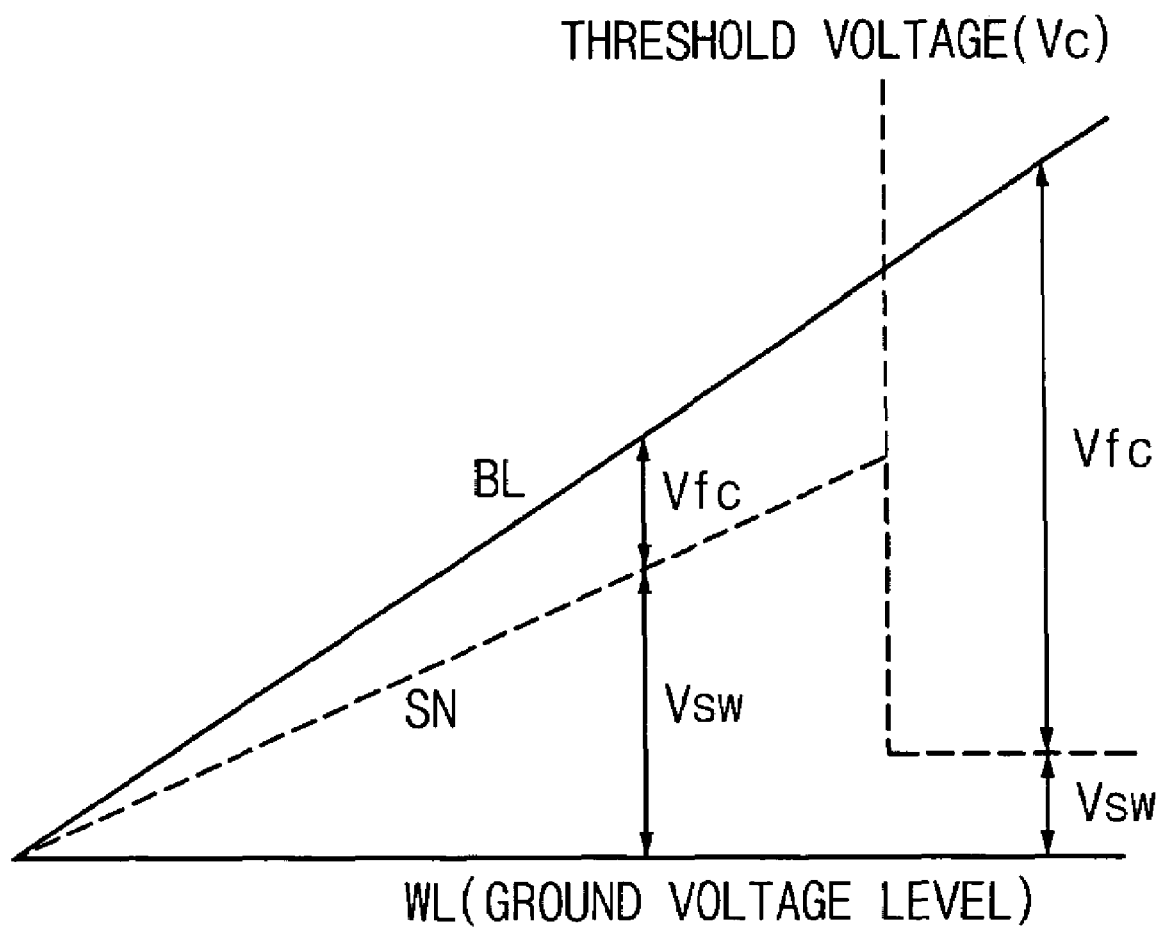

FIGS. 10a to 10c are diagrams illustrating the voltage dependency of the word line and the bit line of the multiple-layer serial diode cell according to an embodiment of the present invention.

Referring to FIG. 10a, a voltage flowing in the nonvolatile ferroelectric capacitor FC connected between the word line WL and a node SN refers to a voltage Vfc, and a voltage flowing in the serial diode switch 10 connected between the node SN and the bit line BL refers to a voltage Vsw.

FIG. 10b is a diagram illustrating the voltage dependency of the word line WL in the multiple-layer serial diode cell according to an embodiment of the present invention.

When a voltage of the word line WL increases while a voltage of the bit line BL is fixed at a ground voltage level, the voltage of the word line WL is distributed in the nonvolatile ferroelectric capacitor FC and the serial diode switch 10.

That is, when the voltage of the word line WL increases while the voltage of the bit line BL is at the ground level, the PN diode switch 12 of the serial diode switch 10 is turned on in a small voltage, so that current flows.

Here, the small voltage Vsw is distributed to the serial diode switch 10 by the forward operation characteristic of the PN diode switch 12. On the other hand, the large voltage Vfc of the word line WL voltage is distributed to the nonvolatile ferroelectric capacitor FC, thereby improving the operation characteristic.

FIG. 10c is a diagram illustrating the voltage dependency of the bit line BL in the multiple-layer serial diode cell according to an embodiment of the present invention.

When the voltage of the bit line BL increases while the voltage of the word line WL is fixed at the ground voltage level, the voltage of the bit line BL is distributed in the nonvolatile ferroelectric capacitor FC and the serial diode switch 10.

That is, when the voltage of the bit line BL increases while the voltage of the word line WL is at the ground level, the PNPN diode switch 11 of the serial diode switch 10 is kept off before the voltage of the bit line BL reaches the threshold voltage Vc. The PN diode switch 12 of the serial diode switch 10 is kept off by its backward operation characteristic. As a result, the large voltage Vsw of the bit line BL voltage is distributed to the serial diode switch 10.

On the other hand, when the serial diode switch 10 is at a turn-off state, the small voltage Vfc of the bit line BL voltage is distributed to the nonvolatile ferroelectric capacitor FC. As a result, data stored in the nonvolatile ferroelectric capacitor Fc is not changed, so that the operation is kept at a stationary state.

Thereafter, when the voltage of the bit line BL rises to be over the threshold voltage Vc, the PNPN diode switch 11 of the serial diode switch 10 is turned on. As a result, the voltage Vfc of the bit line BL voltage is distributed to the nonvolatile ferroelectric capacitor FC, so that new data can be written in the nonvolatile ferroelectric capacitor FC.

Figure 11:
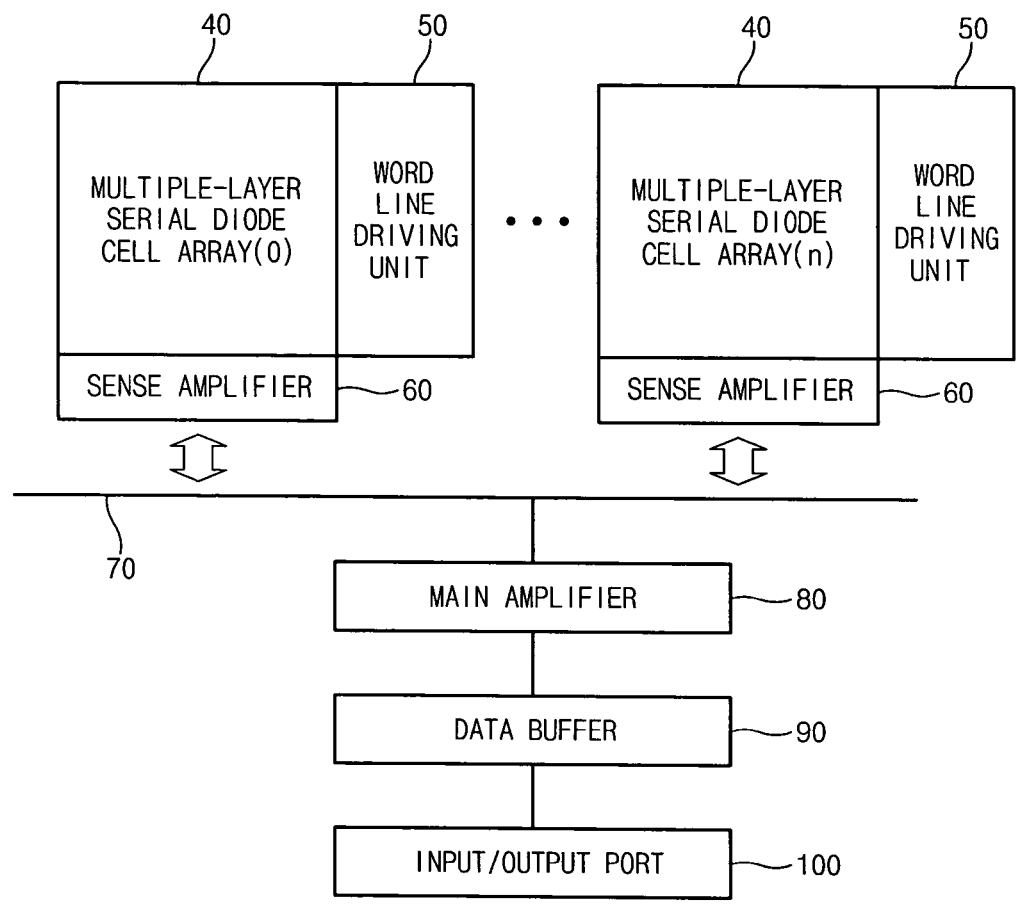
FIG. 11 is a diagram illustrating a nonvolatile memory device using a multiple-layer serial diode cell according to an embodiment of the present invention.

FIG. 11 is a diagram illustrating a nonvolatile memory device using a multiple-layer serial diode cell according to an embodiment of the present invention.

In an embodiment, the nonvolatile memory device comprises a plurality of multiple-layer serial diode cell arrays 40, a plurality of word line driving units 50, a plurality of sense amplifiers 60, a data bus 70, a main amplifier 80, a data buffer 90 and an input/output port 100.

In each multiple-layer serial diode cell array 40, a plurality of serial diode cells shown in FIG. 1 are arranged in row and column directions. A plurality of word lines WL arranged in the row direction are connected to the word line driving unit 50. A plurality of bit lines BL arranged in the column direction are connected to the sense amplifier 60.

Here, one multiple-layer serial diode cell array 40 is correspondingly connected to one word line driving unit 50 and one sense amplifier 60.

A plurality of sense amplifiers 60 share one data bus 70. The data bus 70 is connected to the main amplifier 80 which amplifies data applied from each sense amplifier 60 through the data bus 70.

The data buffer 90 buffers the amplified data applied from the main amplifier 80. The input/output port 100 externally outputs output data applied from the data buffer 90, and applies externally applied input data to the data buffer 90.

Figure 12:
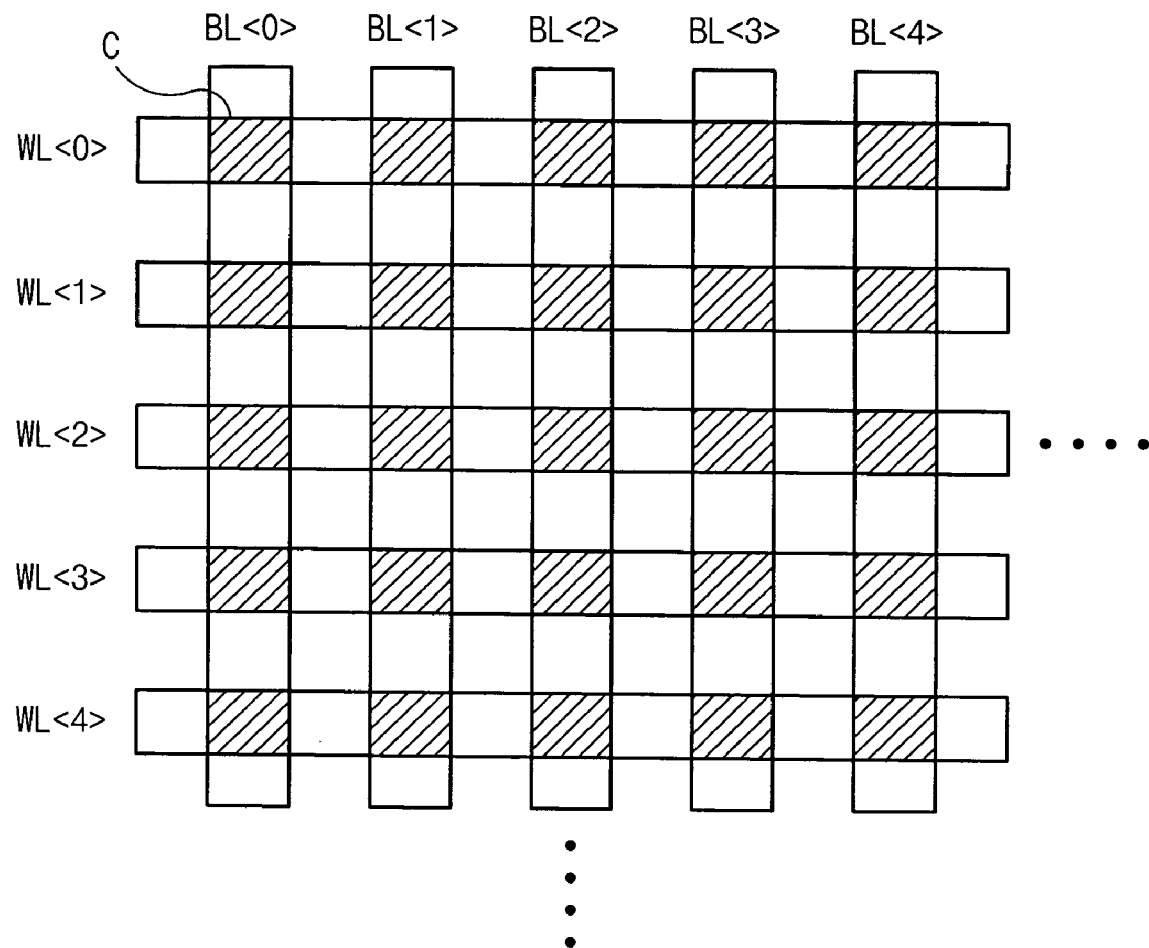
FIG. 12 is a layout diagram illustrating a multiple-layer serial diode cell array of FIG. 11.

FIG. 12 is a layout diagram illustrating the multiple-layer serial diode cell array 40 of FIG. 11.

The multiple-layer serial diode cell array 40 includes a plurality of word lines WL arranged in a row direction and a plurality of bit lines BL arranged in a column direction. Since a unit cell C is positioned where the word line WL and the bit line are crossed, a cross point cell which does not require an additional area can be embodied.

Here, the cross point cell does not comprise a NMOS transistor which uses an additional word line WL gate control signal. The cross point cell refers to a structure where the nonvolatile ferroelectric capacitor FC is located at a cross point of the bit line BL and the word line WL with the serial diode switch 10 comprising two electrode nodes.

Figure 13:
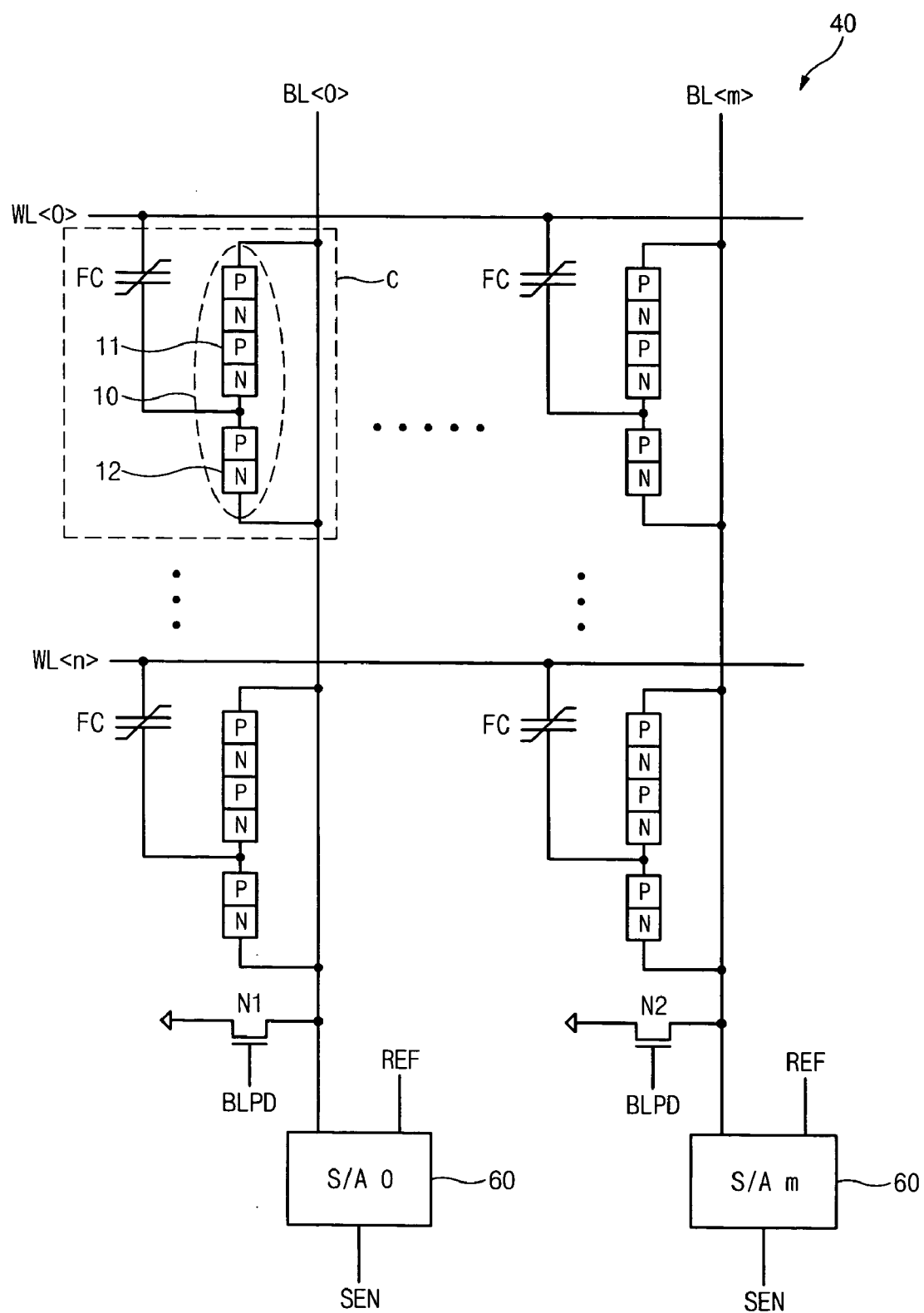
FIG. 13 is a circuit diagram illustrating the multiple-layer serial diode cell array of FIG. 11.

FIG. 13 is a circuit diagram illustrating the multiple-layer serial diode cell array 40 of FIG. 11.

The multiple-layer serial diode cell array 40 comprises a plurality of word lines WL<0>~WL<n> each arranged in the row direction and a plurality of bit lines BL<0>~BL<m> each arranged in the column direction. A unit cell C is located only in a region where the word line WL and the bit line BL are crossed. Here, one unit cell C comprises the nonvolatile ferroelectric capacitor FC and the serial diode witch 10.

The plurality of sense amplifiers 60 are connected one by one to the plurality of bit lines BL<0>~BL<m>. When a sense amplifier enable signal SEN is activated, each sense amplifier 60 compares a previously set reference voltage REF with a voltage applied from the bit line BL and amplifies the comparison result.

A bit line pull-down device N1 is connected to the bit line BL<0>, and a bit line pull-down device N2 is connected to the bit line BL<m>. When a bit line pull-down signal BLPD is activated, the bit line pull-down devices N1 and N2 apply a ground voltage to the bit line BL to pull down the bit line BL to the ground level.

The above-described multiple-layer serial diode cell array 40 is configured so that each of the nonvolatile ferroelectric capacitors FC can store one data.

Figure 14:
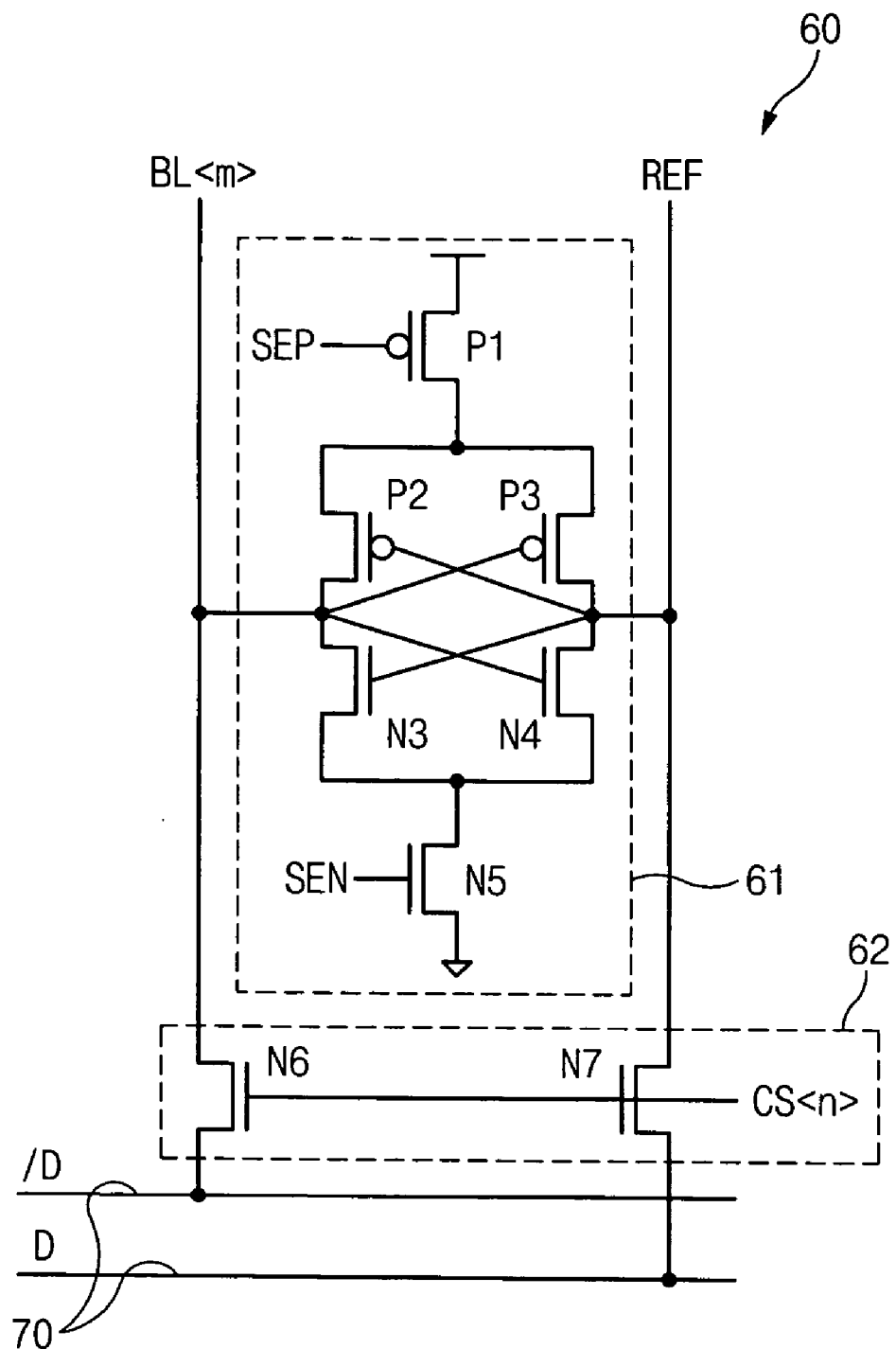
FIG. 14 is a circuit diagram illustrating a sense amplifier of FIG. 13.

FIG. 14 is a circuit diagram illustrating the sense amplifier 60 of FIG. 13.

The sense amplifier 60 comprises an amplification unit 61 and a column selection switching unit 62.

Here, the amplification unit 61 comprises PMOS transistors P1~P3 and NMOS transistors N1~N3. The PMOS transistor P1, connected between a power voltage terminal and a common source of the PMOS transistors P2 and P3, has a gate to receive a sense amplifier enable signal SEP. The cross-coupled PMOS transistors P2 and P3 latch a power voltage applied through the PMOS transistor P1.

A NMOS transistor N5, connected between a ground voltage terminal and a common source of NMOS transistors N3 and N4, has a gate to receive the sense amplifier enable signal SEN. The cross-coupled NMOS transistors N3 and N4 latch the ground voltage applied through the NMOS transistor N5.

Here, the sense amplifier enable signal SEN has an opposite phase to that of the sense amplifier enable signal SEP. When the sense amplifier enable signal SEN is activated, the amplification unit 61 is operated. One output terminal of the amplification unit 61 is connected to the bit line BL<m>, and the other output terminal of the amplification unit 61 is connected to a terminal to receive the reference voltage REF.

The column selection switching unit 62 comprises NMOS transistors N6 and N7. The NMOS transistor N6, connected between the bit line BL<m> and the data bus 70, controls input/output operations of data D in response to a column selecting signal CS<n> applied through its gate. The NMOS transistor N7, connected between the data bus 70 and the terminal to receive the reference voltage REF, controls input/output operations of data D in response to the column selecting signal CS<n> applied through its gate.

Figure 15:
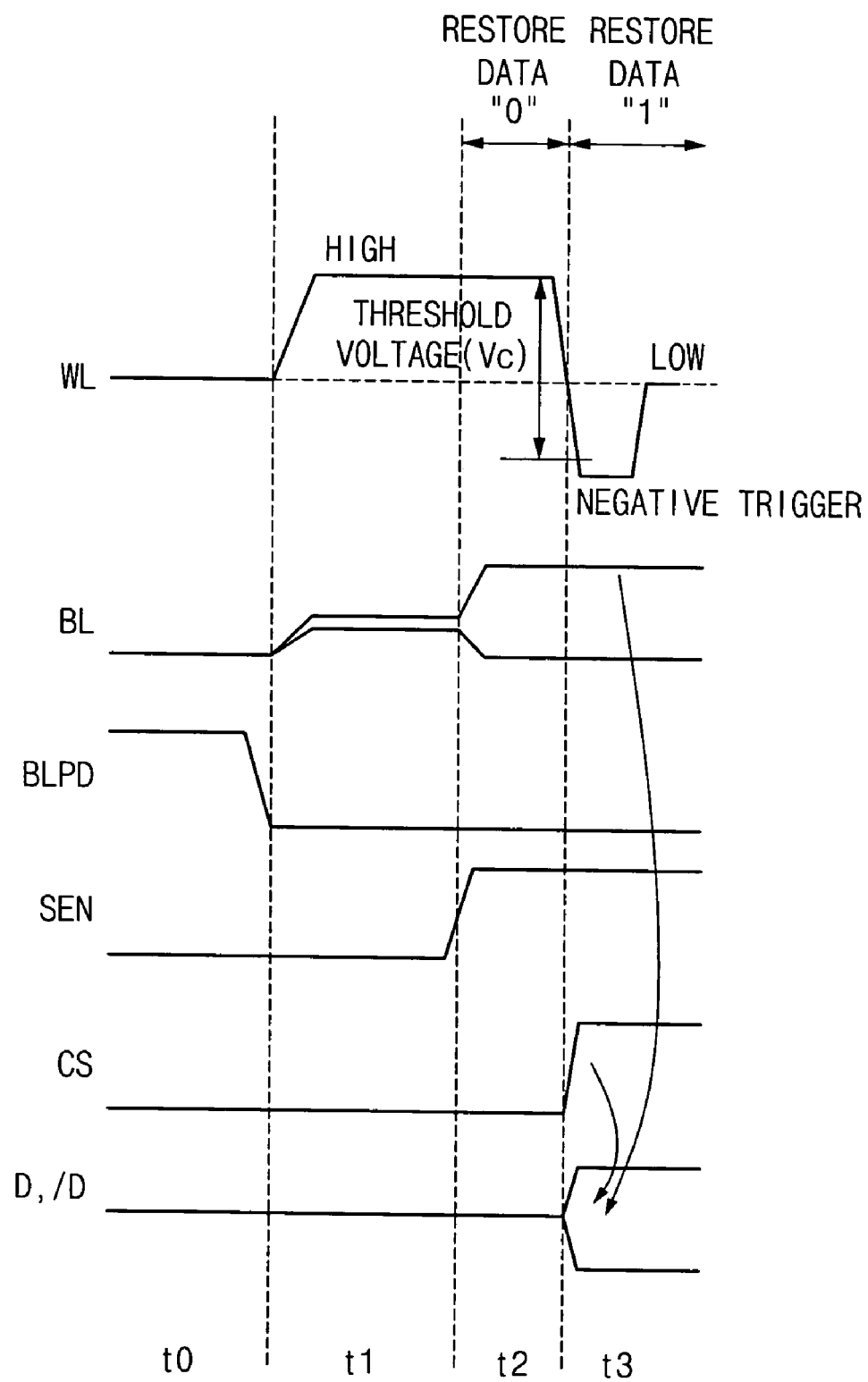
FIG. 15 is a timing diagram illustrating the read operation of the nonvolatile memory device using a multiple-layer serial diode cell according to an embodiment of the present invention.

FIG. 15 is a timing diagram illustrating the read operation of the nonvolatile memory device using a multiple-layer serial diode cell according to an embodiment of the present invention.

In a period t0, a bit line pull-down signal BLPD is activated to apply the ground voltage to a pair of the bit lines BL, so that the bit line BL is precharged to the ground level.

Thereafter, when a period t1 starts, if the word line WL transits to 'high' and a predetermined voltage is applied to the word line WL, the PN diode switch 12 of the serial diode switch 10 is turned on. As a result, data of the serial diode cell is transmitted to the bit line BL. Here, the bit line pull-down signal BLPD transits to 'low'.

In a period t2, the sense amplifier enable signal SEN is activated to amplify data in the bit line BL. If the voltage of the bit line BL is amplified to a low level when a voltage of the word line WL is at a high level, data "0" is restored in the serial diode cell C.

Thereafter, in a period t3, the voltage of the word line WL transits to a negative voltage which is a value below the threshold voltage Vc. That is, a difference between the low voltage level of the bit line BL and the negative voltage level of the word line WL does not reach the state of the threshold voltage Vc to turn on the PNPN diode switch 11 of the serial diode switch 10.

However, a voltage over the threshold voltage Vc to turn on the PNPN diode switch 11 is applied depending on the difference between the high amplification voltage of the bit line BL and the negative voltage of the word line WL. As a result, the PNPN diode switch 11 is turned on to restore data "1" in the serial diode cell.

After the PNPN diode switch 11 is turned on, as shown in FIG. 9, a large amount of current can flow although a small voltage Vs is applied to the bit line BL. As a result, in the period t3, although the voltage of the word line WL rises from the negative voltage to the low level, current can flow sufficiently.

In the period t3, if a column selecting signal CS transits to 'high', the NMOS transistors N6 and N7 of the column selection switching unit 62 are turned on. Then, the data D and /D in the bit line BL are outputted to the data bus 70, so that data stored in the serial diode cell C can be read.

Figure 16:
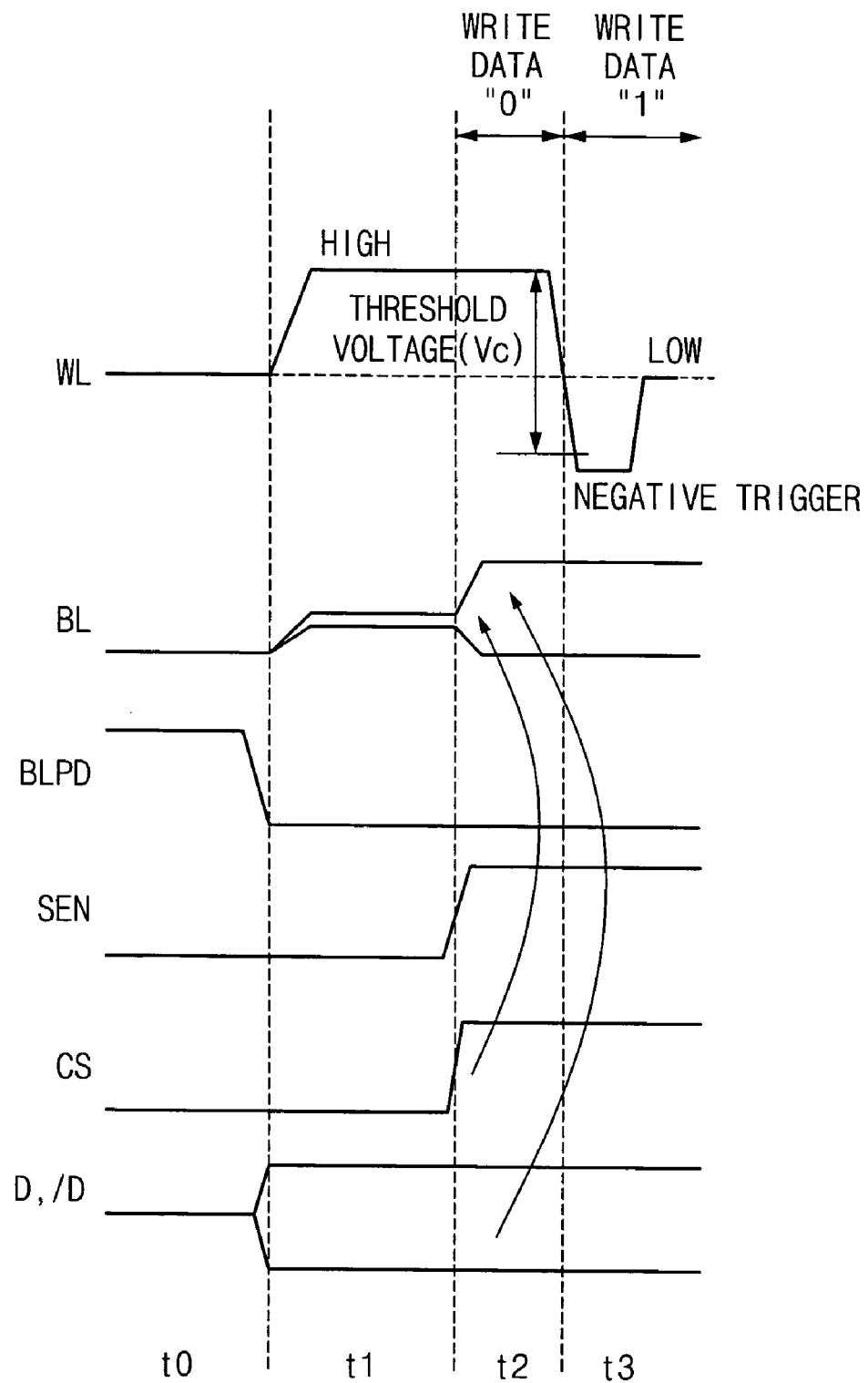
FIG. 16 is a timing diagram illustrating the write operation of the nonvolatile memory device using a multiple-layer serial diode cell according to an embodiment of the present invention.

FIG. 16 is a timing diagram illustrating the write operation of the nonvolatile memory device using a multiple-layer serial diode cell according to an embodiment of the present invention.

In a period t0, the bit line pull-down signal BLPD is activated to apply the ground voltage to the pair of bit lines BL, so that the bit line BL is precharged to the ground level.

Thereafter, when a period t1 starts, if the word line WL transits to 'high', data of the serial diode cell are transmitted to the bit line BL. Here, the bit line pull-down signal BLPD transits to 'low'. Then, new data D and /D to be written through the data bus 70 are inputted in the bit line BL.

In a period t2, the sense amplifier enable signal SEN is activated to amplify data in the bit line BL. If the voltage of the bit line BL is amplified to the low level while the voltage of the word line WL is at the high level, data "0" is written in the serial diode cell C.

Here, if the column selecting signal CS transits to 'high', the NMOS transistors N6 and N7 of the column selection switching unit 62 are turned on, so that the data D and /D inputted through the data bus 70 are applied to the bit line BL.

Thereafter, in a period t3, the voltage of the word line WL transits to the negative voltage. That is, a difference between the low voltage level of the bit line BL and the negative voltage level of the word line WL does not reach the state of the threshold voltage Vc to turn on the PNPN diode switch 11 of the serial diode switch 10.

However, a voltage over the threshold voltage Vc to turn on the PNPN diode switch 11 is applied depending on the difference between the high amplification voltage of the bit line BL and the negative voltage of the word line WL. As a result, the PNPN diode switch 11 is turned on, so that data "1" is written in the serial diode cell.

Although a nonvolatile ferroelectric memory device is exemplified as a memory device for storing data herein, the memory device according to an embodiment of the present invention can include a DRAM device or a flash device.

As described above, a nonvolatile memory device using a multiple-layer serial diode cell has the following effects: to configure a serial diode switch to have a multiple-layer with an interlayer insulating film, thereby reducing the array size without layout expansion; to embody a cross point cell using a nonvolatile ferroelectric capacitor and a serial diode switch which does not an additional gate control signal, thereby reducing the whole size of the nonvolatile memory device; and to effectively drive read/write operations in cell arrays using the nonvolatile ferroelectric capacitor and the serial diode switch which are described above, thereby improving operation characteristics of the memory cell.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A multiple-layer serial diode cell comprising a unit serial diode cell including:
   a serial diode switch comprising an insulating layer formed on a substrate and at least two or more of diode devices which are made of a silicon layer on the insulating layer and connected in series;
   a nonvolatile ferroelectric capacitor, which comprises a top electrode, a ferroelectric film and a bottom electrode, for reading/writing corresponding data depending on the amount of current applied from a word line or a bit line;
   a bit line connected to both nodes of the serial diode switch through a bit line contact node;
   a contact node for connecting an interval between the bottom electrode and a common node connected to two or more of the diode devices; and
   a word line formed on the top electrode,
   wherein a plurality of the unit serial diode cells are arranged in row and column directions, and the plurality of unit serial diode cells are deposited with a multiple structure which is separated by the insulating layer.

2. The multiple-layer serial diode cell according to claim 1, wherein the silicon layer is comprised of growth silicon.

3. The multiple-layer serial diode cell according to claim 1, wherein the silicon layer is comprised of polysilicon.

4. The multiple-layer serial diode cell according to claim 1, wherein the silicon layer forms a successive diode chain including a plurality of PNPN diode switches and a plurality of PN diode switches which are alternately connected in series.

5. The multiple-layer serial diode cell according to claim 4, wherein the bit line contact node is respectively formed on P-type regions of the plurality of PNPN diode switches and on N-type regions of the plurality of PN diode switches.

6. The multiple-layer serial diode cell according to claim 4, wherein the contact node is formed on the common node where N-type regions of the plurality of PNPN diode switches are connected to P-type regions of the plurality of PN diode switches.

* * * * *